(12) United States Patent
Koike

(10) Patent No.: US 12,087,672 B2
(45) Date of Patent: Sep. 10, 2024

(54) SEMICONDUCTOR DEVICE WITH REDUCED THERMAL RESISTANCE FOR IMPROVED HEAT DISSIPATION

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Daisuke Koike, Tama (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 107 days.

(21) Appl. No.: 17/653,692

(22) Filed: Mar. 7, 2022

(65) Prior Publication Data

US 2023/0089603 A1 Mar. 23, 2023

(30) Foreign Application Priority Data

Sep. 22, 2021 (JP) .................................. 2021-154481

(51) Int. Cl.
*H01L 23/495* (2006.01)

(52) U.S. Cl.
CPC .. *H01L 23/49513* (2013.01); *H01L 23/49524* (2013.01); *H01L 23/49562* (2013.01)

(58) Field of Classification Search
CPC ......... H01L 23/49513; H01L 23/49524; H01L 23/49562; H01L 2224/40245; H01L 2224/83385; H01L 24/40
See application file for complete search history.

(56) References Cited

U.S. PATENT DOCUMENTS

| 5,367,191 A | 11/1994 | Ebihara |
| 9,721,875 B2 | 8/2017 | Yoshihara et al. |
| 10,049,960 B2 | 8/2018 | Murai et al. |
| 2010/0052149 A1 | 3/2010 | Nose et al. |

(Continued)

FOREIGN PATENT DOCUMENTS

| JP | S60-0133736 A | 7/1985 |
| JP | H05-075006 A | 3/1993 |

(Continued)

OTHER PUBLICATIONS

Office Action of corresponding Japanese Patent Application No. 2021-0154481 issued on Jun. 25, 2024, 14 pages.

*Primary Examiner* — Robert G Bachner
(74) *Attorney, Agent, or Firm* — Knobbe Martens Olson & Bear LLP

(57) ABSTRACT

This semiconductor device includes: a bed including a first upper surface having a plurality of first grooves and a first lower surface; a first bonding material provided on the first upper surface and in contact with the first grooves; a semiconductor chip including a second upper surface having a first electrode and a second electrode, and a second lower surface, the semiconductor chip being provided on the first bonding material and having the second lower surface connected to the first bonding material; a second bonding material provided on the first electrode and connected to the first electrode; and a first connector having a first end having a plurality of second grooves and connected to the second bonding material, and a second end.

16 Claims, 6 Drawing Sheets

(56) References Cited

U.S. PATENT DOCUMENTS

| | | | |
|---|---|---|---|
| 2010/0187675 A1* | 7/2010 | Shimizu | H01L 21/563 257/E23.116 |
| 2013/0009295 A1* | 1/2013 | Otremba | H01L 24/83 257/676 |
| 2014/0291825 A1* | 10/2014 | Yoneyama | H01L 23/49575 257/676 |
| 2019/0229103 A1 | 7/2019 | Tatsumi et al. | |
| 2020/0294925 A1 | 9/2020 | Yamada | |

FOREIGN PATENT DOCUMENTS

| | | |
|---|---|---|
| JP | H05-0082568 A | 4/1993 |
| JP | 08-017975 A | 1/1996 |
| JP | 08-222585 A | 8/1996 |
| JP | 09-0199517 A | 7/1997 |
| JP | 2832852 B2 | 12/1998 |
| JP | 2008-0153432 A | 7/2008 |
| JP | 2008-0294172 A | 12/2008 |
| JP | 2010-0062365 A | 3/2010 |
| JP | 03170627 U | 9/2011 |
| JP | 2012-0125786 A | 7/2012 |
| JP | 2014-0203861 A | 10/2014 |
| JP | 6214678 B2 | 10/2017 |
| JP | 2018-0064362 A | 4/2018 |
| JP | 2018-0190882 A | 11/2018 |
| JP | 2019-140398 A | 8/2019 |
| WO | WO 2019/0167218 A1 | 9/2019 |
| WO | WO 2019/0244492 A1 | 12/2019 |

* cited by examiner

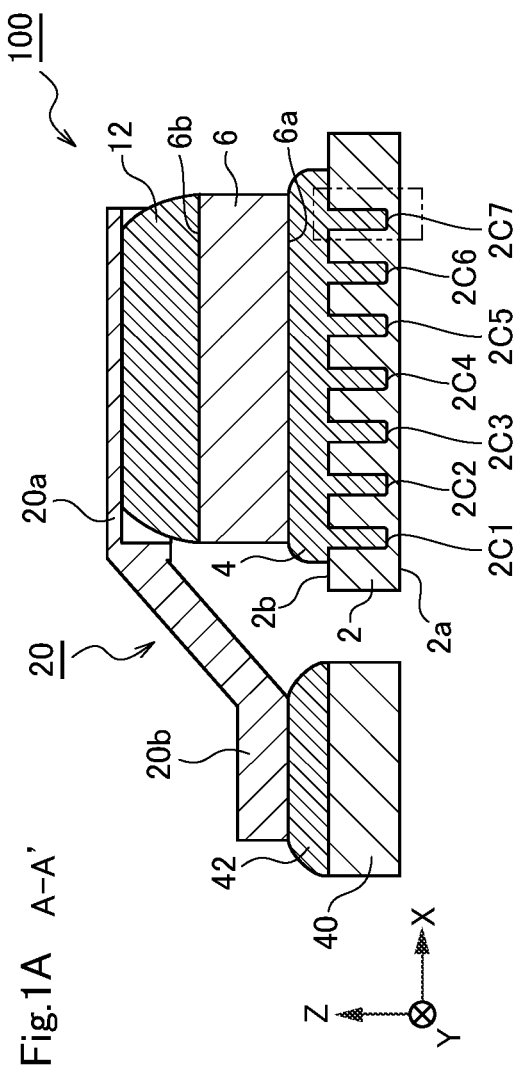
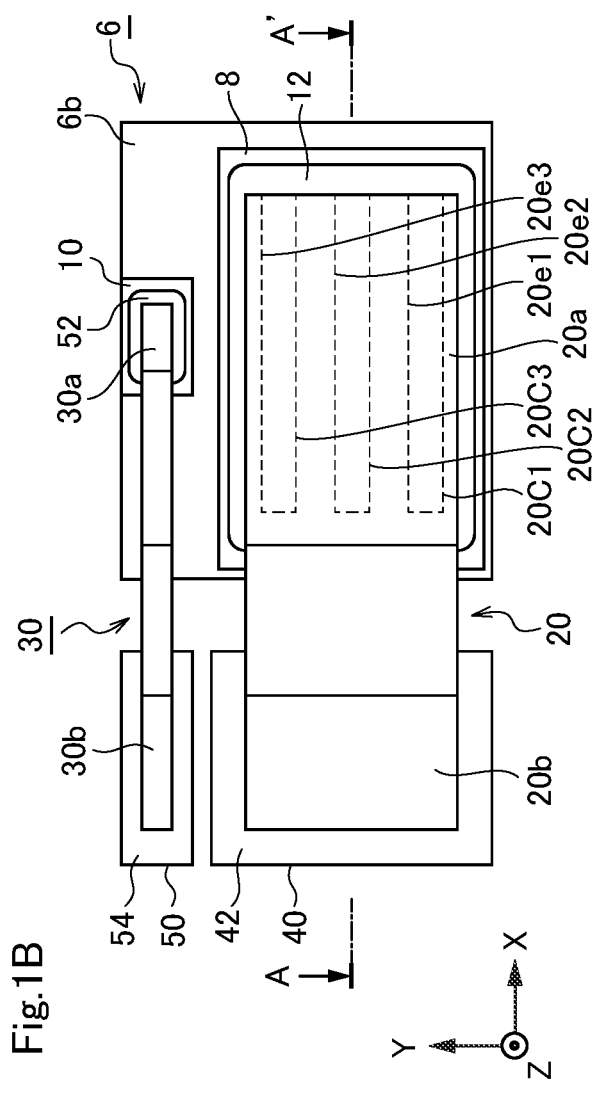
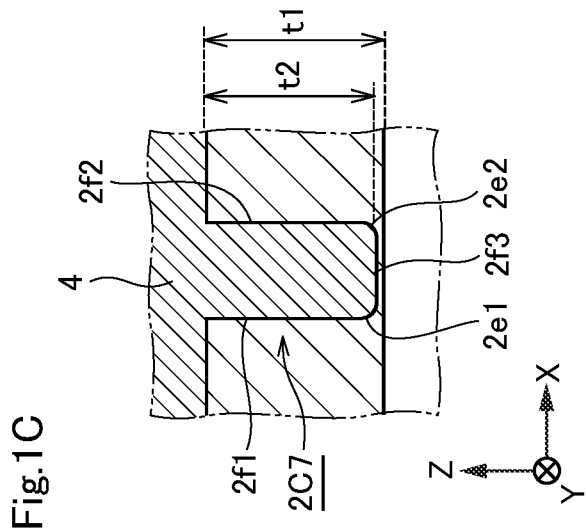

SEMICONDUCTOR DEVICE WITH REDUCED THERMAL RESISTANCE FOR IMPROVED HEAT DISSIPATION

CROSS-REFERENCE TO RELATED APPLICATION

This application is based upon and claims the benefit of priority from Japanese Patent Application No. 2021-154481, filed on Sep. 22, 2021, the entire contents of which are incorporated herein by reference.

FIELD

Embodiments described herein relate generally to a semiconductor device.

BACKGROUND

Power semiconductor chips designed for power control, such as metal-oxide-semiconductor field-effect transistors (MOSFETs) and insulated gate bipolar transistors (IGBTs), have been developed for a wide range of fields including power generation and power transmission, rotary machines such as pumps and blowers, power supply devices in communication systems and factories, railways using AC motors, electric vehicles, or home electric appliances.

In addition, each semiconductor device as a power module using such a power semiconductor chip has been developed. Such a semiconductor device is required to have specifications such as high current density, low loss, and high heat dissipation.

BRIEF DESCRIPTION OF THE DRAWINGS

FIGS. 1A to 1C are schematic views of a semiconductor device according to a first embodiment;

DETAILED DESCRIPTION

Figure 2:
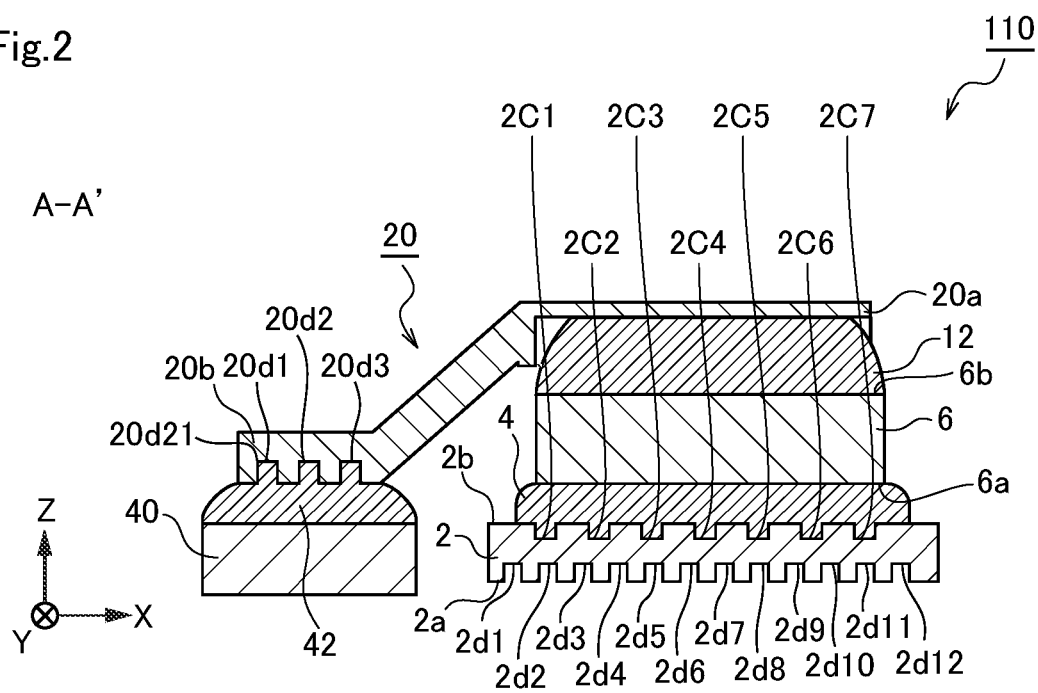
FIG. 2 is a schematic cross-sectional view of a main part of a semiconductor device according to a second embodiment.

A semiconductor device according to an embodiment includes: a bed including a first upper surface having a plurality of first grooves and a first lower surface; a first bonding material provided on the first upper surface and in contact with the first grooves; a semiconductor chip including a second upper surface having a first electrode and a second electrode, and a second lower surface, the semiconductor chip being provided on the first bonding material and having the second lower surface connected to the first bonding material; a second bonding material provided on the first electrode and connected to the first electrode; and a first connector having a first end having a plurality of second grooves and connected to the second bonding material, and a second end.

Hereinafter, embodiments of the present disclosure will be described with reference to the drawings. Note that in the following description, the same members and the like are denoted by the same reference numerals, and the description of the members and the like once described is omitted, if appropriate.

In order to indicate a positional relationship of components and so on, an upward direction in the drawings is herein described as "upper", and a downward direction in the drawings is herein described as "lower". As used herein, the concept of term "upper" or "lower" does not necessarily correspond to the direction of the gravity.

First Embodiment

A semiconductor device according to this embodiment includes: a bed including a first upper surface having a plurality of first grooves and a first lower surface; a first bonding material provided on the first upper surface and in contact with the first grooves; a semiconductor chip including a second upper surface having a first electrode and a second electrode, and a second lower surface, the semiconductor chip being provided on the first bonding material and having the second lower surface connected to the first bonding material; a second bonding material provided on the first electrode and connected to the first electrode; and a first connector having a first end having a plurality of second grooves and connected to the second bonding material, and a second end.

FIGS. 1A to 1C are schematic views of a semiconductor device 100 according to this embodiment. FIG. 1B is a schematic top view of the semiconductor device 100 according to this embodiment. FIG. 1A is a schematic cross-sectional view taken along line A-A' in FIG. 1B. FIG. 1C is a schematic enlarged cross-sectional view of the first groove $2c_7$ and its vicinity boxed in FIG. 1A.

Here, FIGS. 1A to 1C are used to describe the semiconductor device 100 of this embodiment.

A bed 2 has a first upper surface 2b and a first lower surface 2a. The first upper surface 2b has a plurality of first grooves 2c. FIG. 1A illustrates the first groove $2c_1$, the first groove $2c_2$, the first groove $2c_3$, the first groove $2c_4$, the first groove $2c_5$, the first groove $2c_6$, and the first groove $2c_7$.

Here, an X direction, a Y direction perpendicular to the X direction, and a Z direction perpendicular to the X direction and the Y direction are defined. The first upper surface 2b and the first lower surface 2a are disposed parallel to the XY plane. The first grooves 2c each extend in, for instance, the Y direction. However, the way of providing the first grooves 2c is not limited to those illustrated in FIGS. 1A to 1C. The Y direction is an example of the first direction, and the X direction is an example of the second direction.

The bed 2 is formed of, for example, a metal such as Cu (copper) or an alloy. For example, a thin film containing, for example, Au (gold), Pt (platinum), Pd (palladium), Ag (silver), Cu (copper), Sn (tin), or Ni (nickel) may be provided on the first upper surface 2b.

A first bonding material 4 is provided on the first upper surface 2b. The first bonding material 4 is in contact with the first grooves 2c.

A semiconductor chip 6 is provided on the first bonding material 4. Examples of the semiconductor chip 6 include a vertical Si-MOSFET using Si (silicon). Note that the semiconductor chip 6 may be a Si-IGBT, a fast recovery diode (Si-FRD), a SiC-IGBT using silicon carbide (SiC), a SiC-MOSFET or a Schottky barrier diode (SiC-SBD), a GaN-MOSFET using a nitride semiconductor in which a group V element is nitrogen in a group III-V semiconductor, or the like. Further, the semiconductor chip 6 is not necessarily what is called a power semiconductor chip. The semiconductor chip 6 has a second upper surface 6b and a second lower surface 6a. For instance, in the case where the semiconductor chip 6 is a Si-MOSFET, a drain electrode (not shown) is provided on the second lower surface 6a of the semiconductor chip 6. Then, such a drain electrode is connected to the first bonding material 4.

A first electrode 8 and a second electrode 10 having an area smaller than that of the first electrode 8 are provided on the second upper surface 6b of the semiconductor chip 6. For example, in the case where the semiconductor chip 6 is a vertical Si-MOSFET, the first electrode 8 is a source electrode and the second electrode 10 is a gate electrode. The second electrode 10 is provided adjacent to the first electrode 8 in the Y direction when viewed from above. The first electrode 8 and the second electrode 10 are formed by providing a film containing nickel (Ni) on an aluminum (Al) film, for example.

A second bonding material 12 is provided on the first electrode 8. The second bonding material 12 is connected to the first electrode 8.

A first connector 20 has a first end portion (an example of a first end) 20a and a second end portion (an example of a second end) 20b. The first end portion 20a has a plurality of second grooves 20c. In FIGS. 1A to 1C, a second groove $20c_1$, a second groove $20c_2$, and a second groove $20c_3$ are depicted. When viewed from above, the first connector 20 extends, for example, in the X direction. When viewed from above, each second groove 20c preferably extends in the X direction. The second grooves 20c at the first end portion 20a are connected to the second bonding material 12. The first connector 20 contains a conductive material such as Cu.

As illustrated in FIG. 1C, the depth $t_2$ of the first groove $2c_7$ is preferably 90% or more of the height $t_1$ of the bed 2. The same applies to the other first grooves 2c.

As illustrated in FIG. 1C, it is preferable that the R-chamfered portion $2e_1$ is provided between the side surface $2f_1$ of the first groove $2c_7$ and the bottom surface $2f_3$ of the first groove $2c_7$. In addition, it is preferable that the R-chamfered portion $2e_2$ is provided between the side surface $2f_2$ of the first groove $2c_7$ and the bottom surface $2f_3$ of the first groove $2c_7$. Note that the same applies to the other first grooves 2c. The R-chamfered portions $2e_1$ and $2e_2$ are formed, for example, when the first groove 2c is formed by etching. The R-chamfered portion is an example of a curved surface.

Similarly, the R-chamfered portion $20e_1$ is preferably provided between the side surface and the top surface (bottom surface) of the second groove $20c_1$. The R-chamfered portion $20e_2$ is preferably provided between the side surface and the top surface (bottom surface) of the second groove $20c_2$. The R-chamfered portion $20e_3$ is preferably provided between the side surface and the top surface (bottom surface) of the second groove $20c_3$.

A first post portion 40 contains, for example, a conductive material such as Cu. A third bonding material 42 is provided on the first post portion 40. Then, the first post portion 40 and the second end portion 20b are electrically connected via the third bonding material 42. The first post portion 40 is used, for example, to connect the first electrode 8 of the semiconductor chip 6 to an external electric circuit (not shown). Note that neither the first post portion 40 nor the third bonding material 42 may be provided.

A second connector 30 has a third end portion 30a and a fourth end portion 30b. Then, the third end portion 30a is connected via the fourth bonding material 52 to the second electrode 10.

A second post portion 50 contains, for example, a conductive material such as Cu. A fifth bonding material 54 is provided on the second post portion 50. Then, the fourth end portion 30b is connected via the fifth bonding material 54 to the second post portion 50. The second post portion 50 is used, for example, to connect the second electrode 10 of the semiconductor chip 6 to an external electric circuit (not shown). Note that neither the second post portion 50 nor the fifth bonding material 54 may be provided.

The second electrode 10 is provided adjacent to the first electrode 8 in the Y direction when viewed from above. Each second groove 20c preferably extends in the X direction.

However, how the first grooves 2c and the second grooves 20c look is not limited to those illustrated in FIGS. 1A to 1C. For instance, the number and the width of the first grooves 2c or the second grooves 20c are not limited to those illustrated in FIGS. 1A to 1C.

The first bonding material 4, the second bonding material 12, the third bonding material 42, the fourth bonding material 52, and/or the fifth bonding material 54 are, for example, solder. It is possible to preferably use, as the solder, for example, solder containing Pb (lead) and Sn (tin), solder containing Pb, Ag (silver), and Sn (tin), solder containing Sn and Sb (antimony), solder containing Au (gold) and Sn, solder containing Au and Si, or solder containing Au and Ge (germanium).

The first bonding material 4, the second bonding material 12, the third bonding material 42, the fourth bonding material 52, and/or the fifth bonding material 54 are, for example, silver pastes.

The first bonding material 4, the second bonding material 12, the third bonding material 42, the fourth bonding material 52, and/or the fifth bonding material 54 are, for example, metal filler-containing sintered sheets.

The first bonding material 4, the second bonding material 12, the third bonding material 42, the fourth bonding material 52, and/or the fifth bonding material 54 are, for example, die attach (DA) pastes. Each die attach paste contains, for example, a given metal material-containing sintered material and a given resin. A paste containing the above given metal material-containing metal particles, the above given resin, and a given solvent (e.g., a polar solvent) may be heated. Next, the given solvent may be evaporated and the above metal particles are sintered to produce a die attach paste.

Examples of the given metal material to be preferably used include, but are not particularly limited to, Au, Pt, Pd, Ru (ruthenium), Rh (rhodium), Ir (iridium), Ag (silver), Cu (copper), Ni (nickel), Zn (zinc), Bi (bismuth), Fe (iron), Mo (molybdenum), Al (aluminum), Cr (chromium), or V (vanadium). It is particularly preferable to use, as the given metal material, Ag, Cu, or Au because of high thermal and electrical conductivities.

Preferable examples of the given resin include, but are not particularly limited to, a polyethylene resin, a polypropylene resin, a vinyl chloride resin, a polystyrene resin, an acrylonitrile styrene resin, an ABS resin, a polyethylene terephthalate resin, a methacrylic resin, a polyvinyl alcohol resin, a vinylidene chloride resin, a polycarbonate resin, a polyamide resin, an acetal resin, a polybutylene terephthalate resin, a fluororesin, a phenol resin, a melamine resin, a urea resin, a polyurethane resin, an epoxy-based resin, or an unsaturated polyester resin. It is particularly preferable to use, as the given resin, an epoxy-based resin.

Next, the effects of the semiconductor device in this embodiment will be described.

It has been sought to improve reliability by improving heat dissipation of a semiconductor chip. For example, in order to improve the heat dissipation of the semiconductor chip, it is conceivable to increase the size of a heat dissipation plate or fin. However, a large heat dissipation plate or fin is not preferable because they hinder miniaturization of the semiconductor device.

Then, a semiconductor device according to this embodiment includes: a bed including a first upper surface having a plurality of first grooves and a first lower surface; a first bonding material provided on the first upper surface and in contact with the first grooves; a semiconductor chip including a second upper surface having a first electrode and a second electrode, and a second lower surface, the semiconductor chip being provided on the first bonding material and having the second lower surface connected to the first bonding material; a second bonding material provided on the first electrode and connected to the first electrode; and a first connector having a first end portion having a plurality of second grooves and connected to the second bonding material, and a second end portion.

In order to improve the heat dissipation of the semiconductor chip 6, it is preferable to reduce the thermal resistance of a path through which heat is transferred from the inside of the semiconductor chip 6 to the outside of the semiconductor device 100. Here, the thermal resistance of the path depends on the interface thermal resistance between the semiconductor chip 6 and the first bonding material 4, the bulk thermal resistance of the first bonding material 4, the interface thermal resistance between the first bonding material 4 and the bed 2, the bulk thermal resistance of the bed 2, the interface thermal resistance between the semiconductor chip 6 and the second bonding material 12, the bulk thermal resistance of the second bonding material 12, the interface thermal resistance between the second bonding material 12 and the first connector 20, and the bulk thermal resistance of the first connector 20.

By providing the first grooves 2c in the bed 2, a contact area between the first bonding material 4 and the bed 2 increases. Accordingly, the interface thermal resistance between the first bonding material 4 and the bed 2 can be reduced. In addition, by providing the second grooves 20c in the first end portion 20a, a contact area between the second bonding material 12 and the first connector 20 increases. Accordingly, the interface thermal resistance between the second bonding material 12 and the first connector 20 can be reduced. This makes it possible to provide a semiconductor device with improved reliability.

Each first groove 2c preferably has an R-chamfered portion $2e_1$ between the side surface $2f_1$ of the first groove 2c and the bottom surface $2f_3$ of the first groove 2c. This is because if the R-chamfered portion $2e_1$ is not provided, bubbles (voids) may be formed between the first bonding material 4 and the first groove 2c, and the interface thermal resistance may thus increase.

Similarly, the R-chamfered portion $20e_1$ is preferably provided between the side surface and the bottom surface (top surface) of the second groove $20c_1$. This is because if the R-chamfered portion $20e_1$ is not provided, bubbles (voids) may be formed between the second bonding material 12 and the second groove 20c, and the interface thermal resistance may thus increase.

The depth $t_2$ of each first groove 2c is preferably 90% or more of the height $t_1$ of the bed 2. This is because it is possible to increase the areas of the side surface $2f_1$ and the side surface $2f_2$ by securing the depth as much as possible, thereby reducing the interface thermal resistance between the side surface $2f_1$ of the first groove 2c and the first bonding material 4.

The second electrode 10 is provided adjacent to the first electrode 8 in the Y direction when viewed from above. Each second groove 20c preferably extends in the X direction. The second bonding material 12 may protrude, along the second groove 20c, to the outside of the first connector 20. However, if the second electrode 10 is provided adjacent to the first electrode 8 in the X direction and the second grooves 20c each extend along the Y direction, it is difficult for the first electrode 8 and the second electrode 10 to be electrically connected via the second bonding material 12.

According to the semiconductor device of this embodiment, it is possible to provide a semiconductor device with improved reliability.

Second Embodiment

In a semiconductor device according to this embodiment, the first lower surface has a plurality of third grooves. This point is different from the semiconductor device according to the first embodiment. In addition, in the semiconductor device of this embodiment, the second end portion has a plurality of fourth grooves. This point is different from the semiconductor device according to the first embodiment. Here, description of contents overlapping with those of the semiconductor device of the first embodiment will be omitted.

FIG. 2 is a schematic cross-sectional view of a semiconductor device 110 according to this embodiment.

The first lower surface 2a has a plurality of third grooves 2d. In FIG. 2, the third groove $2d_1$, the third groove $2d_2$, the third groove $2d_3$, the third groove $2d_4$, the third groove $2d_5$, the third groove $2d_6$, the third groove $2d_7$, the third groove $2d_8$, the third groove $2d_9$, the third groove $2d_{10}$, the third groove $2d_{11}$, and the third groove $2d_{12}$ are depicted.

The second end portion 20b has a plurality of fourth grooves 20d. In FIG. 2, the fourth groove $20d_1$, the fourth groove $20d_2$, and the fourth groove $20d_3$ are depicted.

The R-chamfered portion $20d_{21}$ is preferably provided between the side surface and the bottom surface (top surface) of the fourth groove $20d_1$. Note that the same applies to the fourth groove $20d_2$ and the fourth groove $20d_3$.

Figure 3:
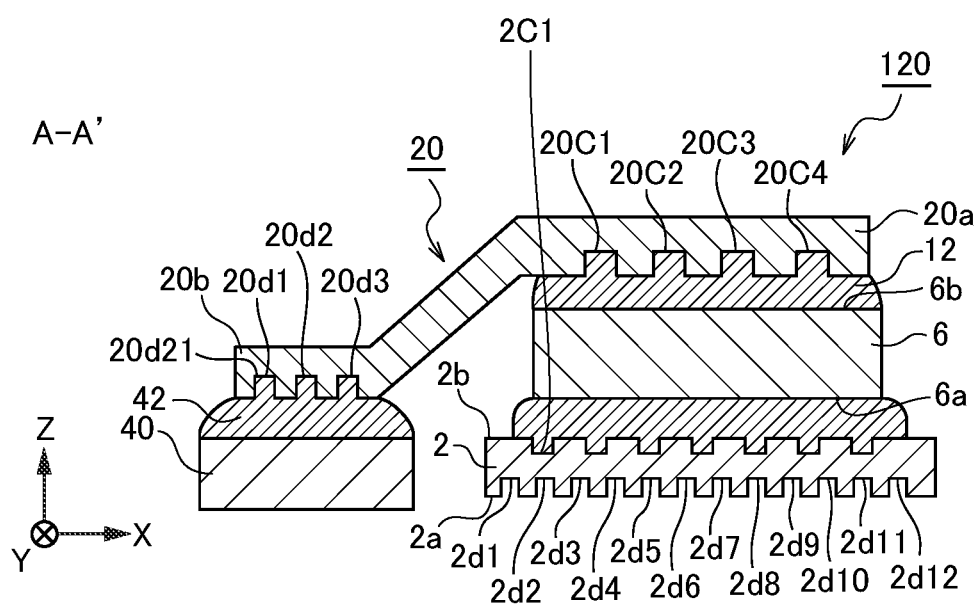
FIG. 3 is a schematic cross-sectional view of a differently embodied main part of a semiconductor device according to the second embodiment.

FIG. 3 is a schematic cross-sectional view of a differently embodied semiconductor device 120 according to this embodiment. The second grooves 20c each extend in the Y direction. This point is different from the semiconductor device 110.

In the semiconductor device 110 or 120, the forms of the first grooves 2c, the third grooves 2d, and the fourth grooves 20d are not limited to those illustrated in FIGS. 1A to 1C. For example, the widths, the numbers, and the extending directions of the first grooves 2c, the third grooves 2d, and the fourth grooves 20d are not limited to those illustrated in FIGS. 2 and 3.

For example, a bonding material (not shown) is provided between the first lower surface 2a and a substrate (not shown) fixed to the first lower surface 2a. By providing the third grooves 3d on the first lower surface 2a, the interface thermal resistance between the bonding material and the bed 2 can be reduced. Thus, it is possible to reduce thermal resistance when heat is dissipated from the semiconductor chip 6 to a substrate (not shown) or the like via the first bonding material 4, the bed 2, and the bonding material (not shown). This makes it possible to provide a semiconductor device with improved reliability.

By providing the fourth grooves 20d at the second end portion 20b, a contact area between the third bonding material 42 and the second end portion 20b increases. Accordingly, the interface thermal resistance between the third bonding material 42 and the second end portion 20b can be reduced. Thus, it is possible to reduce thermal resistance when heat is dissipated from the semiconductor chip 6 to the third bonding material 42 via the second bonding material 12 and the first connector 20. This makes it possible to provide a semiconductor device with improved reliability.

According to the semiconductor device of this embodiment, it is also possible to provide a semiconductor device with improved reliability.

Third Embodiment

In a semiconductor device according to this embodiment, each first groove has a fifth groove and a sixth groove, and the sixth groove intersects the fifth groove. This point is different from the semiconductor device according to the first or second embodiment. Here, description of contents overlapping with those of the first and second embodiments will be omitted.

Figure 4:
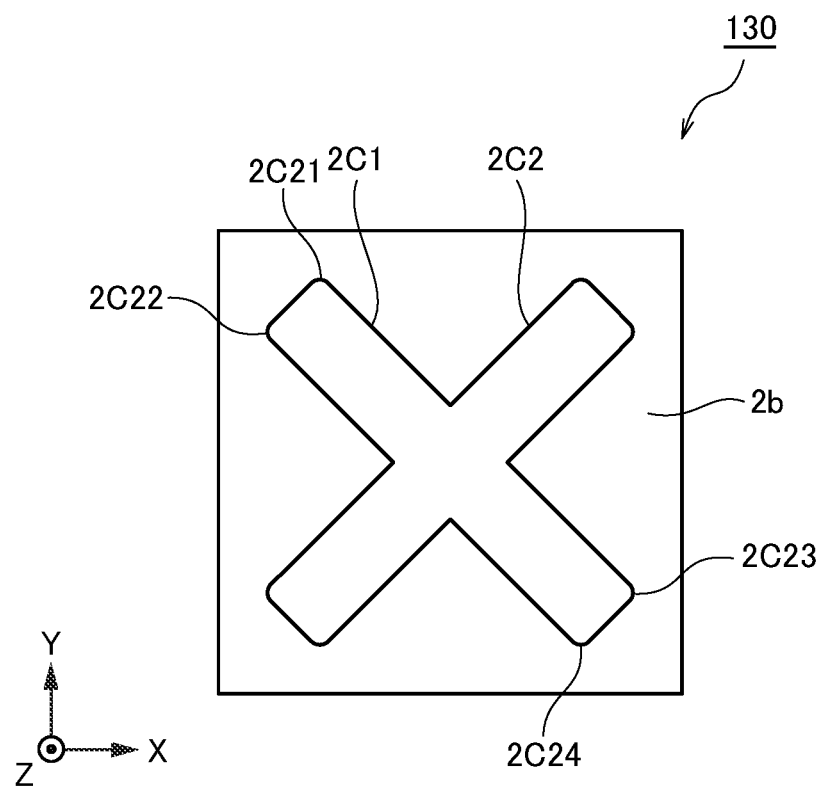
FIG. 4 is a schematic top view of a subject element of a semiconductor device according to a third embodiment.

FIG. 4 is a schematic top view of a subject element of a semiconductor device 130 according to this embodiment. FIG. 4 is a view of the first upper surface 2b of the bed 2 in this embodiment when viewed from above. The first groove $2c_1$ (an example of the fifth groove) and the first groove $2c_2$ (an example of the sixth groove) extend in the direction of 45 degrees with respect to the Y direction and the X direction, respectively. The first groove $2c_2$ is provided perpendicular to the first groove $2c_1$. Note that the forms of the first groove $2c_1$ and the first groove $2c_2$ are not limited to those illustrated in FIG. 4. For example, the first groove $2c_2$ is not necessarily perpendicular to the first groove $2c_1$.

In order to suppress the formation of bubbles (voids) between the first bonding material 4 and the first groove 2c, it is preferable that the R-chamfered portion $2c_{21}$, the R-chamfered portion $2c_{22}$, the R-chamfered portion $2c_{23}$, and the R-chamfered portion $2c_{24}$ are formed at the corners of the first groove $2c_1$. The same applies to the first grooves $2c_2$.

According to the semiconductor device of this embodiment, it is also possible to provide a semiconductor device with improved reliability.

Fourth Embodiment

In a semiconductor device of this embodiment, each first groove further has a seventh groove and an eighth groove, the seventh groove intersects the fifth groove, the sixth groove, and the eighth groove, and the eighth groove intersects the fifth groove, the sixth groove, and the seventh groove. This point is different from the semiconductor device according to the third embodiment. Here, description of contents overlapping with those of the first to third embodiments will be omitted.

Figure 5:
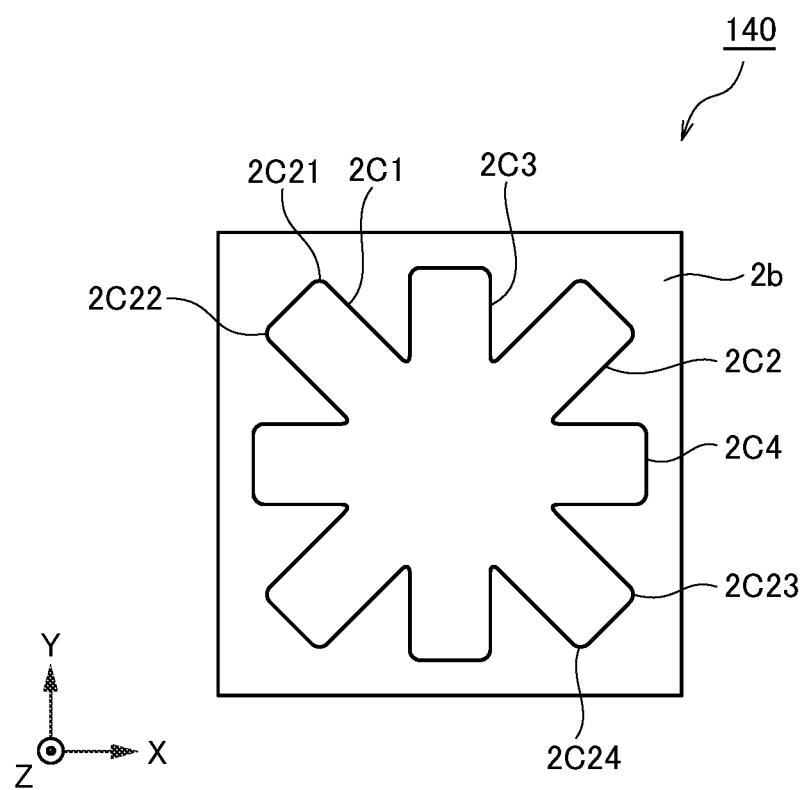
FIG. 5 is a schematic top view of a subject element of a semiconductor device according to a fourth embodiment.

FIG. 5 is a schematic top view of a subject element of a semiconductor device 140 according to this embodiment. FIG. 5 is a view of the first upper surface 2b of the bed 2 in this embodiment when viewed from above. The first upper surface 2b is further provided with a first groove $2c_3$ (an example of the seventh groove) and a first groove $2c_4$ (an example of the eighth groove). The first groove $2c_3$ extends in the Y direction and intersects the first groove $2c_1$, the first groove $2c_2$, and the first groove $2c_4$. The first groove $2c_4$ extends in the X direction and intersects the first groove $2c_1$, the first groove $2c_2$, and the first groove $2c_3$.

In order to suppress the formation of bubbles (voids) between the first bonding material 4 and the first groove 2c, it is preferable that the R-chamfered portion $2c_{21}$, the R-chamfered portion $2c_{22}$, the R-chamfered portion $2c_{23}$, and the R-chamfered portion $2c_{24}$ are formed at the corners of the first groove $2c_1$. The same applies to the first groove $2c_2$, the first groove $2c_3$, and the first groove $2c_4$.

According to the semiconductor device of this embodiment, it is also possible to provide a semiconductor device with improved reliability.

Fifth Embodiment

In a semiconductor device of this embodiment, each first groove has a circular shape in a plane parallel to the first upper surface. This point is different from the semiconductor device according to any of the first to fourth embodiments. Here, description of contents overlapping with those of the first to fourth embodiments will be omitted.

Figure 6:
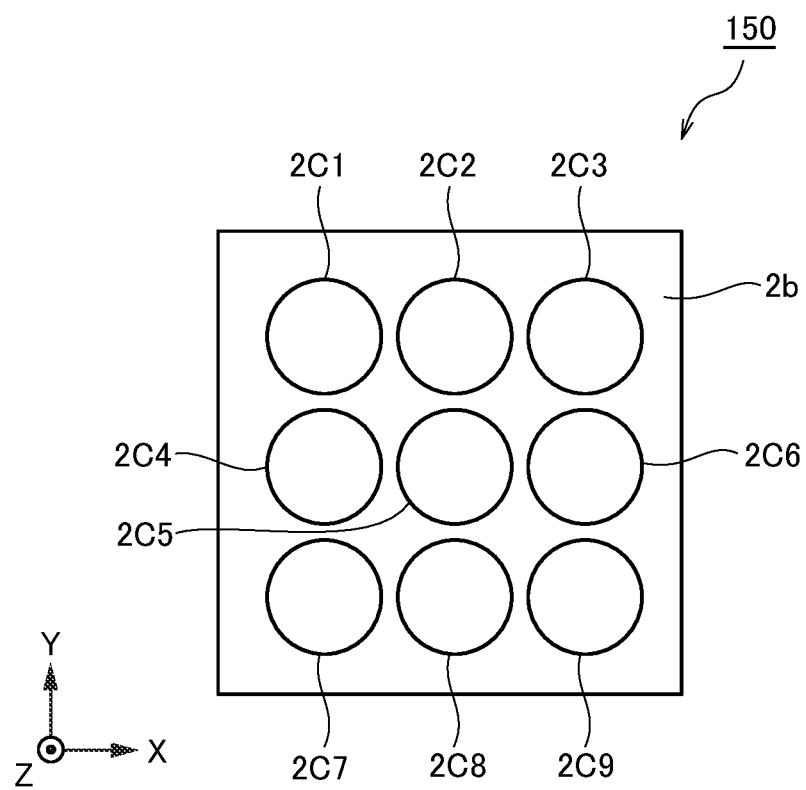
FIG. 6 is a schematic top view of a subject element of a semiconductor device according to a fifth embodiment.

FIG. 6 is a schematic top view of a subject element of a semiconductor device 150 according to this embodiment. FIG. 6 is a view of the first upper surface 2b of the bed 2 in this embodiment when viewed from above. There are provided the first groove $2c_1$, the first groove $2c_2$, the first groove $2c_3$, the first groove $2c_4$, the first groove $2c_5$, the first groove $2c_6$, the first groove $2c_7$, the first groove $2c_8$, and the first groove $2c_9$. Then, the first groove $2c_1$, the first groove $2c_2$, the first groove $2c_3$, the first groove $2c_4$, the first groove $2c_5$, the first groove $2c_6$, the first groove $2c_7$, the first groove $2c_8$, and the first groove $2c_9$ are each shaped like a circle in a plane (in an XY plane) parallel to the first upper surface 2b. Note that the forms of the first grooves 2c are not limited to those illustrated in FIG. 6. For example, although 9 first grooves 2c are illustrated in FIG. 6, the number of first grooves 2c is not limited to 9. In addition, the shape of the first groove 2c in a plane (in an XY plane) parallel to the first upper surface 2b may be, for instance, elliptical.

In the case where the groove is circular, there is no corner. Thus, the above-described bubbles (voids) are unlikely to be formed. This is advantageous because the thermal resistance is unlikely to be lowered.

According to the semiconductor device of this embodiment, it is also possible to provide a semiconductor device with high performance.

While certain embodiments have been described, these embodiments have been presented by way of example only, and are not intended to limit the scope of the inventions. Indeed, each semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:
1. A semiconductor device comprising:
a bed including a first upper surface having a plurality of first grooves and a first lower surface, the first grooves being aligned in a second direction, and the first grooves extending in a first direction intersecting the second direction perpendicular to the first direction;

a first bonding material provided on the first upper surface and in contact with the first grooves;

a semiconductor chip including a second upper surface having a first electrode and a second electrode, and a second lower surface, the semiconductor chip being provided on the first bonding material and having the second lower surface connected to the first bonding material;

a second bonding material provided on the first electrode and connected to the first electrode; and a first connector having a first end having a plurality of second grooves and connected to the second bonding material, and a second end, the second grooves being aligned in the first direction, and the second grooves extending in the second direction perpendicular to the first direction, wherein the first grooves and the second grooves are skewed relative to the semiconductor chip.

2. The semiconductor device according to claim 1, wherein
the first lower surface has a plurality of third grooves.

3. The semiconductor device according to claim 1, wherein
the second end has a plurality of fourth grooves.

4. The semiconductor device according to claim 1, wherein
each first groove further has a curved surface between a side surface of the first groove and a bottom surface of the first groove.

5. The semiconductor device according to claim 1, wherein
a depth of each first groove is 90% or more of a height of the bed.

6. The semiconductor device according to claim 1, wherein
the second electrode is provided adjacent to the first electrode in a first direction when viewed from above.

7. The semiconductor device according to claim 1, wherein
each of the first grooves has a fifth groove and a sixth groove, and
the sixth groove intersects the fifth groove.

8. The semiconductor device according to claim 7, wherein
each of the first grooves further has a seventh groove and an eighth groove,
the seventh groove intersects the fifth groove and the sixth groove, and
the eighth groove intersects the fifth groove, the sixth groove, and the seventh groove.

9. A semiconductor device comprising:
a bed including a first upper surface having a plurality of first grooves and a first lower surface having a plurality of third grooves, a width of each of the third grooves being narrower than a width of each of the first grooves;

a first bonding material provided on the first upper surface and in contact with the first grooves;

a semiconductor chip including a second upper surface having a first electrode and a second electrode, and a second lower surface, the semiconductor chip being provided on the first bonding material and having the second lower surface connected to the first bonding material;

a second bonding material provided on the first electrode and connected to the first electrode; and a first connector having a first end having a plurality of second grooves and connected to the second bonding material, and a second end, wherein the first grooves and the third grooves are skewed relative to the semiconductor chip and wherein the first grooves extend in a direction perpendicular to a direction in which the third grooves extend.

10. The semiconductor device according to claim 9, wherein the second end has a plurality of fourth grooves.

11. The semiconductor device according to claim 9, wherein
each first groove further has a curved surface between a side surface of the first groove and a bottom surface of the first groove.

12. The semiconductor device according to claim 10, wherein a depth of each first groove is 90% or more of a height of the bed.

13. The semiconductor device according to claim 9, wherein
the second electrode is provided adjacent to the first electrode in a first direction when viewed from above, and
the second grooves extend in a second direction intersecting the first direction.

14. The semiconductor device according to claim 10, wherein each of the first grooves has a fifth groove and a sixth groove, and the sixth groove intersects the fifth groove.

15. The semiconductor device according to claim 14, wherein each of the first grooves further has a seventh groove and an eighth groove, the seventh groove intersects the fifth groove and the sixth groove, and the eighth groove intersects the fifth groove, the sixth groove, and the seventh groove.

16. The semiconductor device according to claim 9, wherein
each of the first grooves has a circular shape in a plane parallel to the first upper surface.

* * * * *